United States Patent
Man et al.

(10) Patent No.: US 9,287,087 B2
(45) Date of Patent: Mar. 15, 2016

(54) SAMPLE OBSERVATION METHOD, SAMPLE PREPARATION METHOD, AND CHARGED PARTICLE BEAM APPARATUS

(71) Applicant: HITACHI HIGH-TECH SCIENCE CORPORATION, Tokyo (JP)

(72) Inventors: Xin Man, Tokyo (JP); Atsushi Uemoto, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 0 days.

(21) Appl. No.: 13/842,274

(22) Filed: Mar. 15, 2013

(65) Prior Publication Data
US 2013/0248707 A1    Sep. 26, 2013

(30) Foreign Application Priority Data
Mar. 21, 2012   (JP) ................ 2012-064263

(51) Int. Cl.
  *H01J 37/26* (2006.01)
  *H01J 37/28* (2006.01)

(52) U.S. Cl.
  CPC ............. *H01J 37/261* (2013.01); *H01J 37/265* (2013.01); *H01J 37/28* (2013.01); *H01J 2237/20207* (2013.01); *H01J 2237/31745* (2013.01)

(58) Field of Classification Search
  CPC ................ H01J 37/28; H01J 37/305; H01J 2237/20207; H01J 2237/20214; H01J 2237/31749; H01J 2237/31745; H01J 37/261; H01J 37/265
  USPC .......................................... 250/307, 310, 311
  See application file for complete search history.

(56) References Cited

U.S. PATENT DOCUMENTS

| | | | |
|---|---|---|---|
| 5,179,280 A | 1/1993 | Wang | 250/311 |
| 5,525,806 A | 6/1996 | Iwasaki et al. | 250/492.21 |
| 5,541,411 A * | 7/1996 | Lindquist | H01J 37/28 250/307 |
| 7,539,340 B2 * | 5/2009 | Kochi | G01B 15/04 382/154 |
| 7,952,082 B2 * | 5/2011 | Sugizaki | G01N 1/32 250/492.1 |
| 2004/0173746 A1 * | 9/2004 | Petrov | G01N 23/225 250/310 |
| 2005/0103995 A1 * | 5/2005 | Yanagiuchi | G01N 23/225 250/309 |
| 2006/0289757 A1 * | 12/2006 | Kochi | H01J 37/265 250/310 |
| 2008/0237456 A1 * | 10/2008 | Miyamoto | G01B 15/04 250/252.1 |

(Continued)

FOREIGN PATENT DOCUMENTS

| | | |
|---|---|---|
| JP | 06231720 | 8/1994 |
| JP | 2007066527 | 3/2007 |

(Continued)

*Primary Examiner* — Wyatt Stoffa
(74) *Attorney, Agent, or Firm* — Adams & Wilks

(57) ABSTRACT

In a sample observation method, a sample stage is placed at a first tilt angle with respect to a charged particle beam, and an observation surface of a sample is irradiated with the charged particle beam to acquire a first charged particle image. The sample stage is then tilted to a second tilt angle different from the first tilt angle about a first sample stage axis, and the observation surface is again irradiated with the charged particle beam to acquire a second charged particle image. The sample stage is tilted to a tilt angle at which an area of the observation surface in the acquired charged particle image is the larger of the first charged particle image and the second charged particle image. The observation surface is then irradiated with the charged particle beam to observe the observation surface.

10 Claims, 5 Drawing Sheets

(56) References Cited

U.S. PATENT DOCUMENTS

| | | | | |
|---|---|---|---|---|
| 2009/0127474 | A1* | 5/2009 | Tsuneta | H01J 37/20 250/442.11 |
| 2010/0033560 | A1* | 2/2010 | Kawasaki | G01N 23/203 348/79 |
| 2011/0226947 | A1* | 9/2011 | Takahashi | H01J 37/20 250/307 |
| 2013/0026361 | A1* | 1/2013 | Yamanashi | H01J 37/1478 250/307 |
| 2013/0068949 | A1* | 3/2013 | Urano | H01J 37/153 250/310 |
| 2013/0248354 | A1* | 9/2013 | Keady | H01J 37/3005 204/192.33 |

FOREIGN PATENT DOCUMENTS

| | | |
|---|---|---|
| JP | 2010078332 | 4/2010 |
| JP | 2011066005 | 3/2011 |
| JP | 2011150840 | 8/2011 |

* cited by examiner

SAMPLE OBSERVATION METHOD, SAMPLE PREPARATION METHOD, AND CHARGED PARTICLE BEAM APPARATUS

CROSS-REFERENCE TO RELATED APPLICATIONS

This application claims priority from Japanese Patent Application No. 2012-064263 filed on Mar. 21, 2012, the entire contents of which are incorporated herein by reference.

TECHNICAL FIELD

Aspects of the present invention relate to a sample observation method for observing a sample by irradiation of a charged particle beam.

BACKGROUND

A focused ion beam apparatus is known as an apparatus for processing and observing a fine sample such as a semiconductor device. A FIB-SEM composite apparatus is known as an apparatus for observing a sample under processing by a focused ion beam through a scanning electron microscope in real time.

In the FIB-SEM composite apparatus, in general, an FIB column and an SEM column are arranged so that an angle formed by an irradiation axis of the FIB column and an irradiation axis of the SEM column is approximately between 50 degrees to 60 degrees. With this arrangement, the same region of a sample can be observed by FIB and SEM.

Due to the reduction in device dimensions in recent years, it has been required to observe a cross-section processed by FIB with a high resolution by SEM. As an apparatus for realizing fine processing by FIB and high resolution observation by SEM, there has been proposed a composite charged particle beam apparatus in which the FIB column and the SEM column are arranged perpendicularly (see JP-A-H06-231720).

In this apparatus, the cross-section processed by FIB can be observed by SEM from a direction perpendicular thereto. In SEM observation, in general, when an observation surface of a sample is observed from a direction perpendicular thereto, observation can be performed with a high resolution. According to the apparatus described in JP-A-H06-231720, the cross-section processed by FIB is irradiated with an electron beam simultaneously from the direction perpendicular to the cross-section, and hence, SEM observation can be performed with a high resolution.

As an observation preparation for high resolution SEM observation, it is necessary to adjust a position of the sample so that the observation surface of the sample is perpendicular to an irradiation axis of the electron beam. As a position adjusting method, for example, there is known a method of measuring heights of the sample at a plurality of points in the observation surface, calculating a tilt of the observation surface based on the measurement results, and tilting the sample so as to correct the tilt of the observation surface. In this case, the heights of the sample are measured by tilting the sample and measuring the eucentric height at each measurement point in the observation surface.

According to this method, however, the sample needs to be moved and tilted many times, and hence, observation preparation time becomes long. Further, a tip of a beam column, a detector, and other components are arranged close together in the vicinity of the sample at the intersection of an ion beam and an electron beam, and hence, the tilt angle of the sample cannot be increased, and thus, the eucentric height cannot be adjusted with high accuracy. Thus, it has been difficult to measure the sample height with high accuracy.

SUMMARY

Aspects of the present invention provide a sample observation method and a charged particle beam apparatus for observing a sample in a manner that an observation surface is disposed perpendicularly to an irradiation direction of a charged particle beam efficiently and accurately.

According to an exemplary embodiment of the present invention, there is provided a sample observation method for observing an observation surface of a sample by irradiation of a charged particle beam, the method including: placing a sample stage at a first tilt angle with respect to the charged particle beam, and irradiating the observation surface with the charged particle beam to acquire a first charged particle image; tilting the sample stage to a second tilt angle different from the first tilt angle about a first sample stage axis, and irradiating the observation surface with the charged particle beam to acquire a second charged particle image; tilting the sample stage to a tilt angle at which an area of the observation surface in the acquired charged particle image is larger between the first charged particle image and the second charged particle image; and irradiating the observation surface with the charged particle beam to observe the observation surface.

Accordingly, the observation surface can be observed in a manner that the observation surface is placed to be perpendicular to the charged particle beam.

According to the sample observation method of the present invention, the observation surface can be disposed perpendicularly to the irradiation direction of the charged particle beam efficiently and accurately, and hence, the observation surface can be observed with a high resolution.

DETAILED DESCRIPTION

A sample observation method according to an embodiment of the present invention will be described hereinafter.

Figure 1:
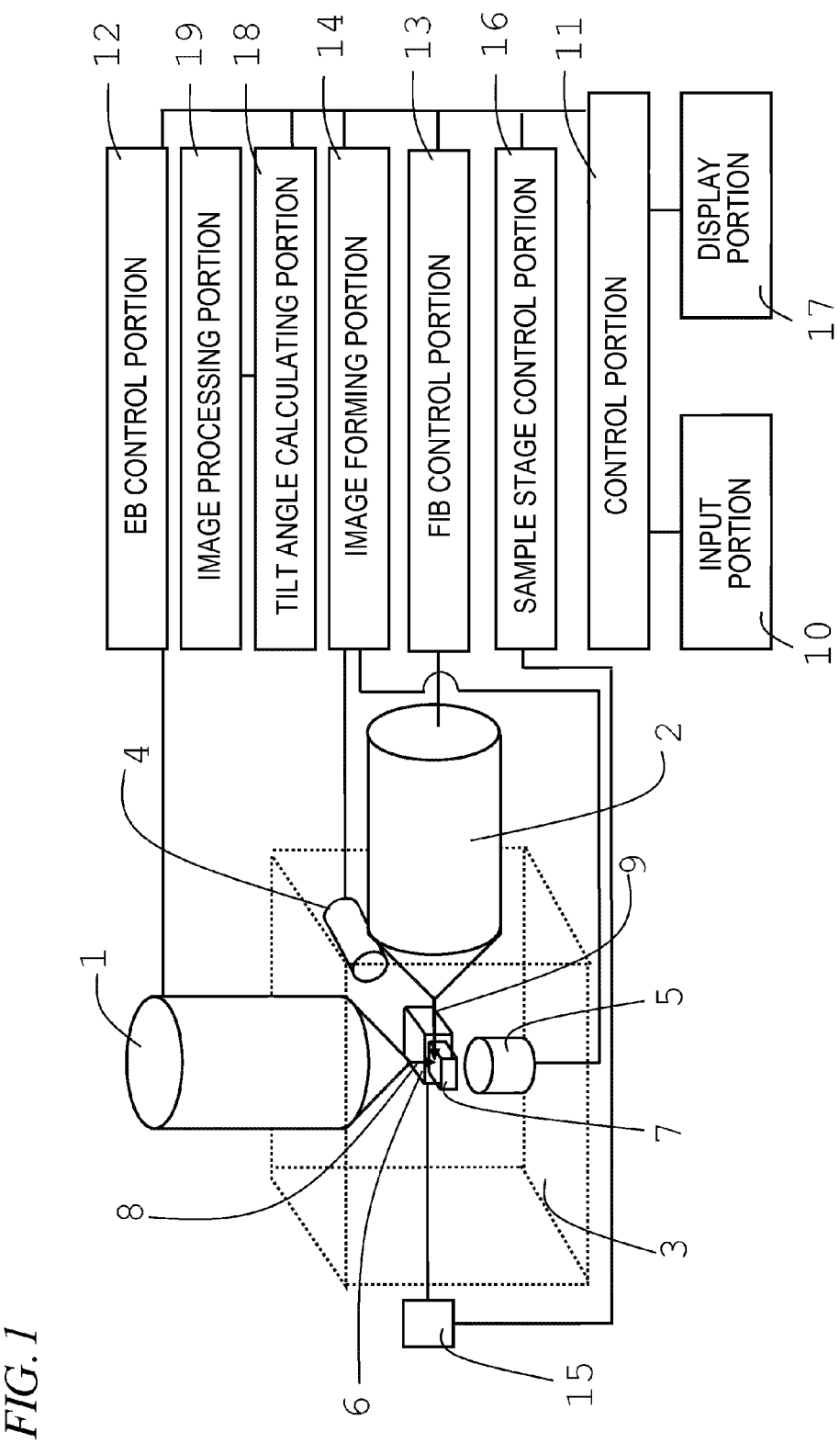
FIG. 1 is a configuration diagram of a charged particle beam apparatus according to an embodiment of the present invention.

First, a charged particle beam apparatus for performing the sample observation method is described. As illustrated in FIG. 1, the charged particle beam apparatus includes an EB column 1, an FIB column 2, and a sample chamber 3. The EB column 1 and the FIB column 2 irradiate a sample 7 accommodated in the sample chamber 3 with an electron beam 8 and an ion beam 9, respectively. The EB column 1 and the FIB column 2 are arranged so that the irradiation axes thereof are orthogonal to each other on the sample 7. Note that, a FIB column provided with a gas field ionization ion source may be used instead of the EB column 1.

The charged particle beam apparatus further includes a secondary electron detector 4 and a transmission electron detector 5 as charged particle detectors. The secondary electron detector 4 is capable of detecting secondary electrons generated from the sample 7 by irradiation of the electron beam 8 or the ion beam 9. The transmission electron detector 5 is provided at a position opposed to the EB column 1. The transmission electron detector 5 is capable of detecting transmitted electrons that have transmitted through the sample 7 and the electron beam 8 that has not entered the sample 7 as a result of the irradiation of the electron beam 8 to the sample 7.

The charged particle beam apparatus further includes a sample stage 6 for holding the sample 7. The sample stage 6 can be tilted or rotated to change an incident angle of the electron beam 8 to the sample 7. The sample stage 6 is driven by a sample stage driving portion 15, and the movement of the sample stage 6 is controlled by a sample stage control portion 16.

The sample stage driving portion 15 moves the sample stage 6 in three axis directions of the X, Y, and Z directions. The sample stage driving portion 15 tilts the sample stage 6 in a first tilt direction 24 about a first sample stage axis direction 23 parallel to the irradiation axis of the FIB column 2. Further, the sample stage driving portion 15 tilts the sample stage 6 in a second tilt direction 28 about a second sample stage axis direction 27 orthogonal to both the irradiation axis of the EB column 1 and the irradiation axis of the FIB column 2.

The charged particle beam apparatus further includes an EB control portion 12, an FIB control portion 13, an image forming portion 14, and a display portion 17. The EB control portion 12 transmits an irradiation signal to the EB column 1 to control the EB column 1 to radiate the electron beam 8. The FIB control portion 13 transmits an irradiation signal to the FIB column 2 to control the FIB column 2 to radiate the ion beam 9.

The image forming portion 14 forms a transmission electron image based on a signal for scanning the electron beam 8 sent from the EB control portion 12 and a signal of the transmission electrons detected by the transmission electron detector 5. The display portion 17 is capable of displaying the transmission electron image. The image forming portion 14 forms data of an SEM image based on the signal for scanning the electron beam 8 sent from the EB control portion 12 and a signal of the secondary electrons detected by the secondary electron detector 4. The display portion 17 is capable of displaying the SEM image. Further, the image forming portion 14 forms data of an SIM image based on a signal for scanning the ion beam 9 sent from the FIB control portion 13 and a signal of the secondary electrons detected by the secondary electron detector 4. The display portion 17 is capable of displaying the SIM image.

The charged particle beam apparatus further includes an input portion 10 and a control portion 11. An operator inputs conditions on the apparatus control to the input portion 10. The input portion 10 transmits the input information to the control portion 11. The control portion 11 transmits a control signal to the EB control portion 12, the FIB control portion 13, the image forming portion 14, the sample stage control portion 16, or the display portion 17, to thereby control the operation of the charged particle beam apparatus.

The charged particle beam apparatus further includes a tilt angle calculating portion 18 and an image processing portion 19. The tilt angle calculating portion 18 calculates an optimum tilt angle of the sample stage 6 to be described later. For calculating the optimum tilt angle, the image processing portion 19 determines the area of an observation surface in an SEM image by image processing.

Figure 2A:
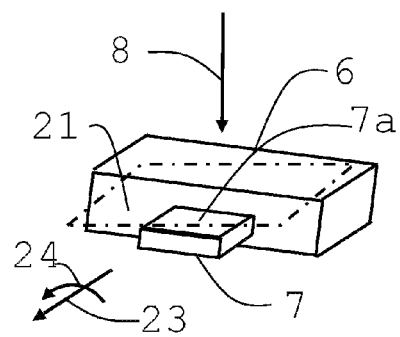
FIGS. 2A to 2D are explanatory diagrams of a sample observation method according to the embodiment of the present invention.
Figure 2B:
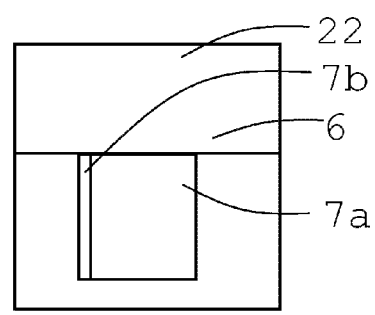
Figure 5:
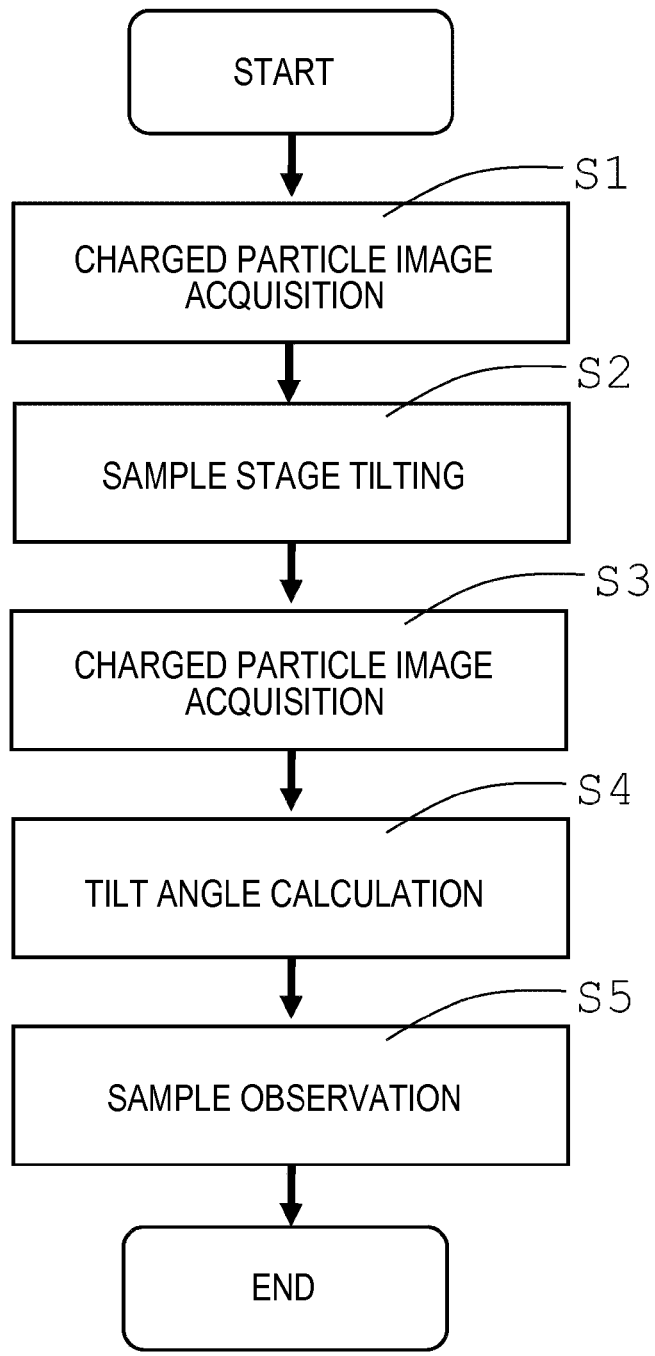
FIG. 5 is a flowchart of the sample observation method according to the embodiment of the present invention.

Next, the sample observation method in this embodiment will be described. First, as illustrated in FIG. 2A, an irradiation region 21 is set to a region including the sample 7. Then, charged particle image acquisition S1 in a flowchart of FIG. 5 is performed. In other words, the irradiation region 21 is irradiated with the electron beam 8, and secondary electrons generated from the irradiation region 21 are detected by the secondary electron detector 4, to thereby acquire a SEM image based on a detection signal of the secondary electron detector 4 and a scanning signal of the electron beam 8. FIG. 2B is an acquired SEM image 22. When an observation surface 7a of the sample 7 is perpendicular to the electron beam 8, a side surface 7b of the sample 7 does not appear in the SEM image 22. However, since the sample 7 is tilted with respect to the irradiation direction of the electron beam 8, the SEM image 22 includes the observation surface 7a of the sample 7 and the side surface 7b of the sample 7.

Figure 2C:
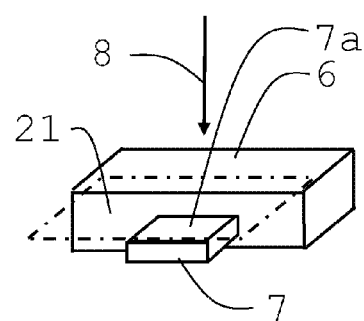

Then, sample stage tilting S2 is performed. In other words, the sample stage 6 is tilted in the first tilt direction 24 about the first sample stage axis direction 23 so that the observation surface 7a is perpendicular to the electron beam 8. FIG. 2C illustrates a state of the sample stage 6 after tilting.

Figure 2D:
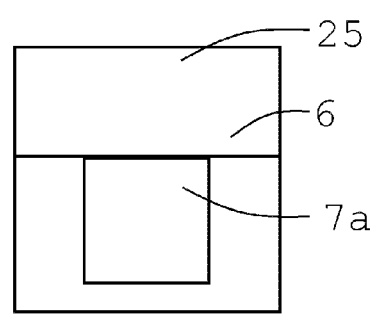

Next, charged particle image acquisition S3 is performed. FIG. 2D is an acquired SEM image 25.

Then, tilt angle calculation S4 is performed. When the observation surface 7a is perpendicular to the electron beam 8, the area of the observation surface 7a in the SEM image becomes larger than that when the observation surface 7a is tilted in other directions. Regarding this, the area of the observation surface 7a in the SEM image 22 and the area of the observation surface 7a in the SEM image 25 are compared. As a result of the comparison, a tilt angle of the sample stage 6 at which the area of the observation surface 7a in the acquired SEM image is larger is calculated as an optimum tilt angle. In this case, the observation surface 7a in the SEM image 25 has a larger area, and hence the tilt angle of the sample stage 6 at the time of acquiring the SEM image 25 is calculated as the optimum tilt angle.

Next, sample observation S5 is performed. In other words, the sample stage 6 is tilted at the optimum tilt angle, and the observation surface 7a is placed so as to be perpendicular to the irradiation direction of the electron beam 8. Then, the observation surface 7a is observed by irradiation of the electron beam 8. In this case, the observation surface 7a is observed from the direction perpendicular thereto, and hence the observation can be performed with a high resolution.

Note that, it is also possible to calculate a more optimum tilt angle in order to adjust the tilt angle of the sample stage 6 more accurately. In other words, in addition to the above-mentioned calculation of the optimum tilt angle, the sample stage 6 is tilted about the second sample stage axis direction 27 perpendicular to the first sample stage axis direction 23, to thereby calculate a more optimum tilt angle.

Figure 3A:
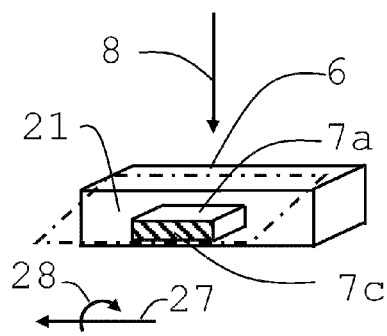
FIGS. 3A to 3D are explanatory diagrams of the sample observation method according to the embodiment of the present invention.
Figure 3B:
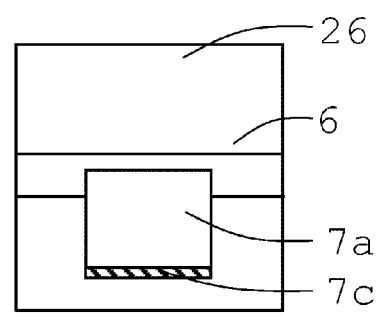

As illustrated in FIG. 3A, the irradiation region 21 is irradiated with the electron beam 8 to acquire an SEM image. FIG. 3B is an SEM image 26. The observation surface 7a is not perpendicular to the irradiation direction of the electron beam 8, and hence, a side surface 7c of the sample 7 appears in the SEM image 26. Accordingly, the sample stage 6 is tilted about the second sample stage axis direction 27.

Figure 3C:
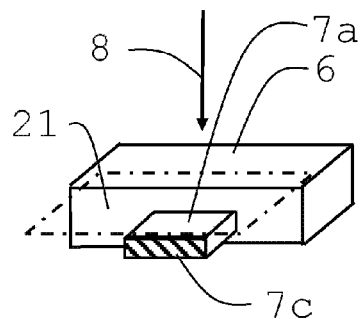
Figure 3D:
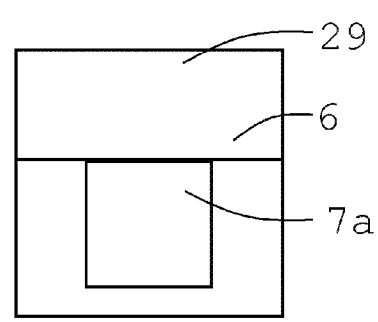

FIG. 3C illustrates the tilted state, and FIG. 3D is an SEM image 29 acquired in this state.

Then, the area of the observation surface 7a in the SEM image 26 and the area of the observation surface 7a in the SEM image 29 are compared. As a result of the comparison, a tilt angle of the sample stage 6 at which the area of the observation surface 7a in the acquired SEM is larger is calculated as an optimum tilt angle. In this case, the observation surface 7a in the SEM image 29 has a larger area, and hence, the tilt angle of the sample stage 6 at the time of acquiring the SEM image 29 is calculated as the optimum tilt angle.

The sample stage 6 is tilted at the optimum tilt angle, and the observation surface 7a is placed so as to be perpendicular to the irradiation direction of the electron beam 8. Then, the observation surface 7a is observed by irradiation of the electron beam 8. The tilt angle of the sample stage 6 is adjusted based on the two axes, and the observation surface 7a is placed so as to be perpendicular to the electron beam 8 and is observed. Thus, the observation can be performed with a higher resolution.

Further, since the observation surface 7a set at the optimum tilt angle is perpendicular to the irradiation direction of the electron beam 8, with the use of the ion beam 9 radiated to be orthogonal to the electron beam 8, another observation surface parallel to the observation surface 7a can be formed.

Figure 4:
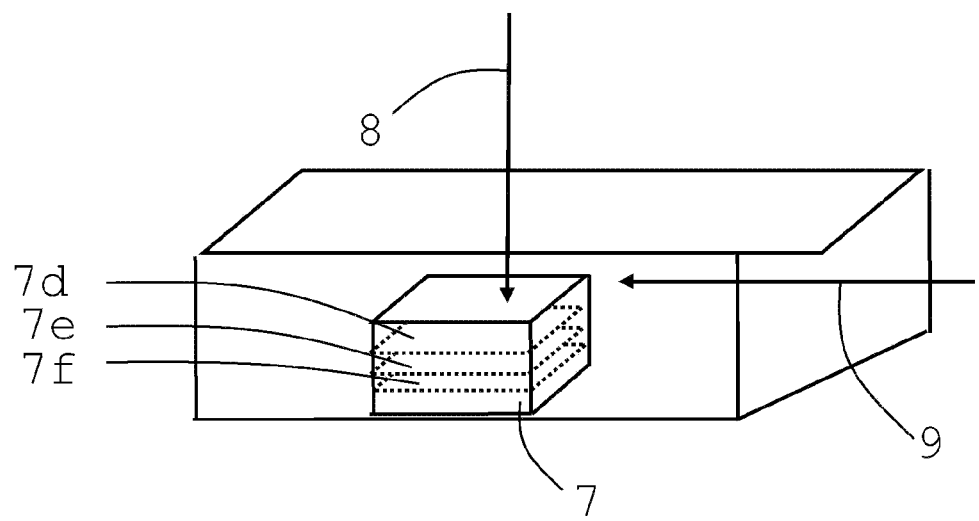
FIG. 4 is an explanatory diagram of a sample processing method according to the embodiment of the present invention.

As illustrated in FIG. 4, the sample 7 is irradiated with the ion beam 9, to thereby perform etching processing so as to peel off the observation surface 7a. In this case, the sample 7 is irradiated with the ion beam 9 from the direction perpendicular to the irradiation direction of the electron beam 8, and hence, an observation surface 7d parallel to the observation surface 7a can be formed.

After the formation of the observation surface 7d, the observation surface 7d can be irradiated with the electron beam 8 from the direction perpendicular thereto without moving the sample stage 6. Thus, similarly to the observation surface 7a, the observation surface 7d can be observed with a high resolution.

Further, observation surfaces 7e and 7f can be observed with a high resolution by repeatedly performing the cross-section formation by the ion beam 9 and the observation by the electron beam 8. In this manner, high resolution SEM images of the observation surfaces 7a, 7d, 7e, and 7f can be acquired and subjected to three-dimensional reconstruction, to thereby acquire a high-accurate three-dimensional image of the sample 7.

What is claimed is:

1. A sample observation method for observing an observation surface of a sample by irradiation of a charged particle beam, the method comprising:
    placing a sample stage at a first tilt angle with respect to the charged particle beam, and irradiating the observation surface with the charged particle beam to acquire a first charged particle image;
    tilting the sample stage to a second tilt angle different from the first tilt angle about a first sample stage axis, and irradiating the observation surface with the charged particle beam to acquire a second charged particle image;
    comparing an area of the observation surface in the first charge particle image with an area of the observation surface in the second charged particle image;
    calculating, as a result of the comparison, a tilt angle as an optimum tilt angle of the sample stage at which the area of the observation surface in the charged particle image is the largest among first charged particle image and the second charged particle image;
    tilting the sample stage to the calculated optimum tilt angle; and
    irradiating the observation surface with the charged particle beam to observe the observation surface.

2. The sample observation method according to claim 1, further comprising:
    tilting the sample stage about a second sample stage axis orthogonal to the first sample stage axis, and irradiating the observation surface with the charged particle beam to acquire a third charged particle image;
    tilting the sample stage to a tilt angle at which the area of the observation surface in the charged particle image is the largest among the first charged particle image, the second charged particle image, and the third charged particle image; and
    irradiating the observation surface with the charged particle beam to observe the observation surface.

3. A sample preparation method comprising:
    preparing another observation surface by irradiating the observation surface with an ion beam from a direction perpendicular to the charged particle beam to process the observation surface while observing the observation surface by the sample observation method according to claim 1.

4. A charged particle beam apparatus, comprising:
    a charged particle beam column configured to irradiate the observation surface of a sample with a charged particle beam;
    a sample stage configured to hold the sample;
    a sample stage driving portion configured to tilt the sample stage about a tilt axis of the sample stage;
    a charged particle detector configured to detect charged particles generated from the observation surface by irradiation of the charged particle beam;
    an image forming portion configured to form charged particle images of the observation surface at a plurality of tilt angles based on detection signals of the charged particle detector; and
    a tilt angle calculating portion configured to calculate a tilt angle at which an area of the observation surface in the charged particle image becomes the largest by comparing the area of the observation surface in the charged particle images.

5. The charged particle beam apparatus according to claim 4, further comprising an image processing portion configured to determine the area of the observation surface by image processing.

6. The charged particle beam apparatus according to claim 4, further comprising a focused ion beam column configured to irradiate the observation surface with a focused ion beam from a direction orthogonal to the charged particle beam.

7. A sample observation method for observing an observation surface of a sample by irradiation of a charged particle beam, the method comprising:
    providing a sample stage holding the sample and configured to be tilted to a plurality of tilt angles to change an incident angle of the charged particle beam to the sample;
    acquiring a charged particle image of the observation surface of the sample at each of the plurality of tilt angles by irradiating the observation surface of the sample with the charged particle beam;
    calculating as an optimum tilt angle a tilt angle of the sample stage at which an area of the observation surface in the acquired charged particle image becomes the largest by comparing the area of the observation surface in the acquired charged particle mages; and
    irradiating the observation surface of the sample with the charged particle beam while the sample stage is tilted to the optimum tilt angle to observe the observation surface of the sample.

8. The sample observation method according to claim 7, further comprising determining the area of the observation surface in the acquired charged particle images by image processing.

9. The sample observation method according to claim 7, further comprising irradiating the observation surface of the sample with a focused ion beam from a direction orthogonal to the charged particle beam.

10. A sample preparation method comprising:
preparing another observation surface by irradiating the observation surface of the sample with an ion beam from a direction perpendicular to the charged particle beam to process the observation surface while observing the observation surface by the sample observation method according to claim 7.

* * * * *